(12) United States Patent
Forbes

(10) Patent No.: US 8,212,250 B2
(45) Date of Patent: Jul. 3, 2012

(54) BACKSIDE TEXTURING BY CUSPS TO IMPROVE IR RESPONSE OF SILICON SOLAR CELLS AND PHOTODETECTORS

(76) Inventor: Leonard Forbes, Corvallis, OR (US)

( * ) Notice: Subject to any disclaimer, the term of this patent is extended or adjusted under 35 U.S.C. 154(b) by 0 days.

(21) Appl. No.: 13/134,749

(22) Filed: Jun. 16, 2011

(65) Prior Publication Data

US 2011/0248265 A1    Oct. 13, 2011

Related U.S. Application Data

(63) Continuation-in-part of application No. 12/927,423, filed on Nov. 15, 2010, now Pat. No. 8,120,027.

(51) Int. Cl.
*H01L 29/04* (2006.01)
*H01L 31/0232* (2006.01)
*H01L 21/02* (2006.01)
*H01L 21/00* (2006.01)

(52) U.S. Cl. ..... 257/53; 257/432; 257/437; 257/E31.13; 257/E31.127; 438/69; 438/71

(58) Field of Classification Search ............ 257/53, 257/432, 437, E31.13, E31.127; 438/69, 438/71
See application file for complete search history.

(56) References Cited

U.S. PATENT DOCUMENTS

| | | |
|---|---|---|
| 3,487,223 A | 12/1969 | St.John |
| 4,419,533 A | 12/1983 | Czubatyj et al. |
| 4,673,770 A | 6/1987 | Mandelkorn |
| 4,999,308 A | 3/1991 | Nishiura et al. |
| 5,080,725 A | 1/1992 | Green et al. |
| 5,296,045 A | 3/1994 | Banerjee et al. |
| 5,589,704 A | 12/1996 | Levine |
| 5,627,081 A | 5/1997 | Tsuo et al. |
| 5,641,362 A | 6/1997 | Meier |
| 6,072,117 A | 6/2000 | Matsuyama et al. |
| 7,582,515 B2 | 9/2009 | Choi et al. |
| 2003/0213515 A1 | 11/2003 | Sano et al. |
| 2008/0223436 A1 | 9/2008 | den Boer et al. |
| 2009/0078316 A1 | 3/2009 | Khazeni et al. |

OTHER PUBLICATIONS

J.E. Cotter, "Optical Intensity of Light in Layers of Silicon with Rear Diffuse Reflectors", Journal of Applied Physics, vol. 84, No. 1 pp. 618-624, Jul. 1, 1998.

(Continued)

*Primary Examiner* — Kevin Parendo

(57) ABSTRACT

The absorption coefficient of silicon for infrared light is very low and most solar cells absorb very little of the infrared light energy in sunlight. Very thick cells of crystalline silicon can be used to increase the absorption of infrared light energy but the cost of thick crystalline cells is prohibitive. The present invention relates to the use of less expensive microcrystalline silicon solar cells and the use of backside texturing with diffusive scattering to give a very large increase in the absorption of infrared light. Backside texturing comprises a plurality of cusped features providing diffusive scattering. Constructing the solar cell with a smooth front surface results in multiple internal reflections, light trapping, and a large enhancement of the absorption of infrared solar energy.

25 Claims, 6 Drawing Sheets

OTHER PUBLICATIONS

O. Berger, D. Inns, and A.E. Aberle, "Commercial White Paint as Back Surface Reflector for Thin-Film Solar Cells", Solar Energy Materials & Solar Cells, vol. 91, pp. 1215-1221, 2007.

L. Forbes and M.Y. Louie, "Backside Nanoscale Texturing to Improve IR Response of Silicon Photodetectors and Solar Cells," Nanotech, vol. 2, pp. 9-12, Jun. 2010.

A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.

M. Born and E. Wolf, "Princip les of Optics, 7th Ed.", Cambridge University Press, 1999, pp. 246-255.

S.W. Chang, V.P. Chuang, S.T. Boles, and C.V. Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.

S. Brieger, O. Dubbers, S. Fricker, A. Manzke, C. Pfahler, A. Plettl, and P. Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.

AREAS $$\frac{d^2}{dx^2} = \frac{1}{1+\left(\frac{x}{R}\right)^2} \qquad FT\left(\frac{a}{2} \cdot e^{-a|x|}\right) = \frac{1}{1+\left(\frac{k}{a}\right)^2}$$

NORMALIZED CUSP

$$\frac{1}{a} e^{-a|x|}$$

BACKSIDE TEXTURING BY CUSPS TO IMPROVE IR RESPONSE OF SILICON SOLAR CELLS AND PHOTODETECTORS

This invention is a continuation-in-part, CIP, of U.S. non-provisional U.S. patent application Ser. No. 12/927,423 filed on 15 Nov. 2010, by Leonard Forbes, "Backside Nanoscale Texturing to Improve IR Response of Silicon Solar Cells and Photodetectors", which is based on U.S. Provisional Patent Application No. 61/285,416, by L. Forbes, filed on 10 Dec. 2009, "Microcrystalline Silicon Solar Cell with Back Side Texturing for Improved Infrared Absorption and Stacked Double Layer Solar Cells," for which the priority date of 10 Dec. 2009 is claimed.

TECHNICAL FIELD

The present invention relates to silicon solar cells with improved energy conversion efficiency. More specifically, the present invention relates to backside texturing by cusps of silicon solar cells to provide diffusive backside scattering and reflection of the incident red and infrared light reaching the backside.

BACKGROUND

Texturing has been used as a technique for light trapping and to improve the efficiency of photodetectors and solar cells due to multiple internal reflections and light trapping. A portion of the known literature describes the use of backside texturing of photodiodes to improve the absorption of near infrared light energy. One of the first descriptions of using this technique in photodetectors was by A. E. St. John in U.S. Pat. No. 3,487,223, "Multiple Internal Reflection Structure in a Silicon Detector which is Obtained by Sandblasting". Another description was provided by J. E. Cotter, "Optical intensity of light in layers of silicon with rear diffuse reflectors," Journal of Applied Physics, vol. 84, no. 1, pp. 618-24, 1 Jul. 1998. A more recent description of the same technique on ultra-thin solar cells has been given by O. Berger, D. Inns and A. G. Aberle, "Commercial white paint as back surface reflector for thin-film solar cells," Solar Energy Materials & Solar Cells, vol. 91, pp. 1215-1221, 2007, hereinafter referred to as Aberle. Aberle disclosed the use of white paint as the backside diffuse reflector. Aberle's initial results show a large increase in the absorption with the white paint as a back surface reflector but only a modest ten or twenty percent increase in the quantum efficiency. Aberle's later results indicate that a twenty to forty percent enhancement in conversion efficiency can be obtained on thin film microcrystalline solar cells by adding more titanium dioxide to the white paint. However, thick layers of the order 80 µm or more of paint are required on thin film solar cells which in themselves are only a few micrometers thick.

A recent analysis of the enhancement of infrared absorption in solar cells and photo detectors has been disclosed by L. Forbes and M. Y. Louie, "Backside Nanoscale Texturing to Improve IR Response of Silicon Photodetectors and Solar Cells," Nanotech, vol. 2, pp. 9-12, June 2010. Regularly textured surfaces have been described for solar cells, by A. Arndt, J. F. Allison, J. G. Haynos, and A. Meulenberg, Jr., "Optical properties of the COMSAT non-reflective cell," 11th IEEE Photovoltaic Spec. Conf., p. 40, 1975. The majority of solar cells use single front side textured surfaces. Front side texturing serves to reduce the reflectivity of the silicon surface due to multiple attempts at transmission through the front surface as has been described by A. Arndt. U.S. Pat. No. 5,589,704 to Levine, "Article Comprising a Si-based Photodetector," describes the front side texturing of a photodetector by plasma etching. Surface texturing of the illuminated side of solar cells, in the form of a regular, saw-tooth pattern has also been described in U.S. Pat. No. 5,641,362 to Meier, "Structure and Fabrication Process for an Aluminum Alloy Junction Self-aligned Back Contact Silicon Solar Cell". Further, U.S. Pat. No. 7,582,515, to Choi et al. "Multi-Junction Solar Cells and Methods and Apparatus for Forming Same" discloses a tandem configuration, which is a single piece of semiconducting material. A tandem arrangement as described herein means a single substrate of semiconductor material in which processing has created various layers having individual characteristics of optical, electrical, and/or mechanical properties. U.S. Pat. No. 5,627,081 to Tsuo, et al., describes porous silicon structures on the front side of substrates to reduce reflectance of visible light. U.S. Pat. No. 4,673,770 to Mandelkorn "Glass sealed silicon membrane solar cell" describes a ground and silvered bottom glass cover plate separated from the substrate but not structures etched into or deposited on to the substrate. U.S. Pat. No. 5,080,725 to Green, et al., "Optical properties of solar cells using tilted geometrical features," describes ridges and pyramids etched into the substrate producing reflections only at specific angles. Matsuyama et al., in U.S. Pat. No. 6,072,117, to Matsuyama et al. "Photovoltaic Device Provided with an Opaque Substrate Having a Specific Irregular Surface Structure", disclose solar cells CVD deposited upon opaque substrates with linear recesses. Methods of creating textured surfaces are described by S. W. Chang, V. P. Chuang, S. T. Boles, and C. V. Thompson, "Metal-Catalyzed Etching of Vertically Aligned Polysilicon and Amorphous Silicon Nanowire Arrays by Etching Direction Confinement," Advanced Functional Materials, vol. 20, no. 24, pp. 4364-4370, 2010, and by S. Brieger, O. Dubbers, S. Fricker, A. Manzke, C. Pfahler, A. Plettl and P. Ziemann, "An approach for the fabrication of hexagonally ordered arrays of cylindrical nanoholes in crystalline and amorphous silicon based on the self-organization of polymer micelles," Nanotechnology, vol. 17, pp. 4991-4994, 2006, doi:10.1088/0957-4484/17/19/036.

One of the best examples of the scattering and diffraction of light is the classical treatment of the interaction of light with narrow slits such as given by Born and Wolf, "Principles of Optics, 7$^{th}$ Ed.," Cambridge University Press, 1999, pp. 246-255.

From the foregoing it is apparent that there are conflicting requirements for the absorption of infrared light energy and visible light energy. Front side texturing is desirable to maximize absorption of visible light energy and the backside condition is irrelevant since visible radiation is strongly absorbed and utilized near the front surface. On the other hand, a smooth front side and textured backside is desirable to maximize the utilization of infrared light energy.

Front side textured anti-reflecting layers, or antireflecting layers on top of front side texturing are required to maximize absorption of visible light energy, the backside condition is irrelevant since visible radiation is strongly absorbed near the front surface. On the other hand a smooth front side and textured backside is needed to maximize the utilization of infrared light energy. Front side anti-reflecting layers that transmit visible radiation can be used in conjunction with backside diffusive texturing since these front side layers will be reflecting in the infrared.

SUMMARY

Accordingly, a semiconductor solar cell or photodetector having improved incident radiation absorption is disclosed, in which a silicon substrate has a substantially planar first surface available to the incident radiation and a layer transparent to visible light and infrared wavelengths is disposed at the first surface. This layer is internally reflective to infrared wavelengths of radiation scattered within the first semiconductor substrate. A textured layer is disposed at a second surface of the silicon substrate, the textured layer being a diffusive radiation scattering layer for infrared wavelengths of radiation, and a reflecting layer disposed on the textured layer and spaced apart from the second surface by the textured layer, whereby infrared wavelengths of radiation are returned through the textured layer toward the first semiconductor substrate.

Another substrate substantially transparent to infrared incident radiation may be stacked with the silicon substrate in a manner leaving a gap between the two substrates, such that a difference between the index of refraction of a substrate and the gap results in infrared wavelength energy internally scattered is reflected back into the latter silicon substrate.

BRIEF DESCRIPTION OF THE DRAWINGS

For a fuller understanding of the nature and advantage of the present invention, reference is being made to the following detailed description of preferred embodiments and in connection with the accompanying drawings, in which.

DETAILED DESCRIPTION

Figure 1:
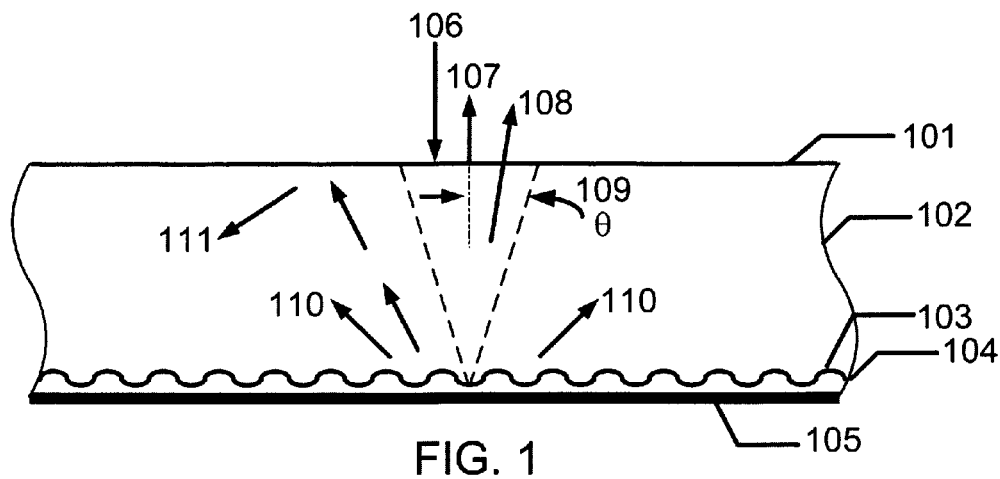
FIG. 1 is an illustration of a solar cell or photodetector cross section with scattered backside total reflection from a regularly textured backside and backside mirror-like reflector.

The conflicting requirements for optimal absorption of both infrared and visible light energy are resolved as described in the following disclosure. Various techniques have been previously described for the texturing of silicon solar cells. The present disclosure relates to irregularly textured silicon technology based solar cells and photodetectors by nanometer- and micrometer-sized structures that produce a true diffuse scattering of desirable wavelengths of incident radiation. While silicon is the preferred semiconductor base material, other elemental and compound semiconductors such as Ge, GaAs, CdTe, CuInGaSe, and others exhibiting a photoelectric effect may also benefit from the use of the present invention. Diffuse scattering or diffuse reflection is an important concept and, as used herein (and compatible with a definition available from Wikipedia.org), is intended to mean the scattering or reflection of light from a surface such that an incident ray is reflected at many angles that can be described as arbitrary, rather than at just one precise angle, which is the case of specular reflection. If a surface is completely non-specular, the reflected light will be evenly scattered over the hemisphere surrounding the surface. Materials can reflect diffusely if their surface is randomly rough on the microscopical scale of the radiation being scattered or reflected.

Solar cells and photodetectors are typically comprised of diodes formed in a semiconducting material. The solar cell/photodiode disclosed herein includes a semiconductor bulk substrate with at least one photoelectric conversion diode layer disposed in the substrate and at least one light anti-reflecting region formed in or optically near the semiconductor substrate surface on which the radiation is initially incident. Such incident radiation is expected to occur at a range of angles relative to the plane of the top surface of the semiconductor substrate, including normal to the top surface, and this radiation is considered to be available to the solar cell/photodiode. The light anti-reflecting region includes an air-substrate index of refraction matching layer and, in some embodiments, light diffusing layer with features configured to increase the effective absorption efficiency and energy conversion efficiency of the solar cell/photodetector. The anti-reflecting features may be cones, pyramids, pillars, protrusions and other like features, and, when such features are used for diffusion, are distributed in a random fashion. It should be noted that any feature that produces the desired diffusive light scattering is one that closely approximates a Lambertian scattering surface at the desired wavelengths of radiation. Lambertian scattering is ideal diffuse scattering providing light distributed over the whole half sphere or solid angle of $2\pi$ sterradians. Manipulating the feature sizes, dimensions, etc. allows the light anti-reflecting and light diffusing region to be tunable for a specific wavelength. Varying the material near or deposited upon the anti-reflecting and light diffusing region can also be used to enhance these characteristics.

An embodiment of the solar cell disclosed herein includes a semiconductor bulk substrate with at least one photoelectric conversion diode layer disposed in the substrate and at least one light diffusing region formed in or optically near the semiconductor substrate surface on which the radiation is initially incident and a reflector disposed behind the light diffusing region. The light diffusing features, as discussed above, are chosen from cones, pyramids, pillars, protrusions and other like features, and combinations thereof. These features also closely approximate a Lambertian light scattering surface.

The light diffusing regions are formed by methods known to those skilled in the art to produce micrometer or smaller features on or within substrates of semiconductor material. These may be formed before, during or after the formation of solar cells/photodetectors and are formed on semiconductor substrates that are considered "thick", e.g., having a range of thickness between 500 μm and 5 μm, such as may be the result of the sawing process of a semiconductor ingot. Or, are formed on semiconductor substrates that are considered "thin", e.g., having a range of thickness between 10 μm and 1 μm, such as may be the result of a deposition process yielding microcrystalline silicon or amorphous silicon or both. As employed in the present disclosure, the following terms have the following meanings, compatible with those found at wikipedia.org. Crystalline, or single crystal, silicon is silicon in which the crystal lattice of the entire sample is continuous and unbroken with no grain boundaries. Multicrystalline silicon is a silicon sample in which segments of the silicon are composed of large crystals that may have different orientations with grain boundaries between the crystals. When cut into substrates several different crystals may be visible to the eye. Polycrystalline materials are made of a three dimensional mosaic of small, irregularly shaped crystals. Microcrystalline silicon is a form of silicon having a paracrystalline structure; paracrystalline materials have only short and medium range ordering in their lattice structures over micrometer dimensions. Amorphous silicon has no crystal structure and is disordered, or the atoms are arranged in no particular order.

Traditional solar cells, photodiodes, and photodetectors, designated in FIG. 1, use what is called FSI, or Front Side Illumination technology, where the radiant energy 106 is incident on a planar surface 101 of an absorbing silicon substrate 102. In conventional CMOS imagers employing a photodetector, the substrates 102 are hundreds of micrometers thick but epitaxial or silicon-on-insulator substrates are used to limit the depth of absorption of the incident radiation and CMOS and CCD imagers are sometimes thinned to a few micrometers. Recently solar cells have been fabricated using thin films of microcrystalline silicon. As a result of the thin active film thickness of these devices, the efficiency of the absorption of infrared and long wavelength visible light in thin silicon films has become important.

When the silicon is not strongly absorbing in the near infrared a back side textured surface works in conjunction with a totally internally reflecting front side surface to best increase the absorption of near infrared photons. This results in multiple internal reflections and light trapping.

An embodiment described herein for visible light, infrared, and near infrared, NIR, detectors and imagers and thin film solar cells front side illumination and backside texturing. The backside texturing is particularly designed to provide true diffusive scattering and, in one alternative embodiment has a transparent conductive oxide treated or patterned to produce randomly positioned or otherwise arranged for a scattering property yielding a Lambertian scattering of energy of a selected band of wavelengths and a reflecting layer preferably formed of a metallic material.

Consider now the effect of texturing on the near infrared wavelength response; texturing will also change the absorption in the remaining part of the visible light region but this will not be considered here. A typical semiconductor substrate 102 is shown in cross section in FIG. 1. The back surface 103, i.e., the surface opposite the top surface 101, is coated with a conductive oxide layer 104 that is regularly textured with grooves or ridges or similar patterns to produce an internal reflection that is not specular. In the near infrared the index of refraction of silicon is η=3.42 and the reflectance is about R=30% from a single surface and transmittance through a single surface is T=70% for normal incident waves. The absorption coefficient of silicon is very low in the near infrared. In FIG. 1 radiation under normal incidence, represented by arrow 106, is reflected from the first surface 101, and this is shown as arrow 107. There are successive reflections from both the back, represented by arrows 108 and 110, and internal reflections from the front surface, arrow 111, resulting in a total transmittance, if there is no reflective metal layer 105 disposed on the oxide layer 104, of $$T_{tot}=(TT)(1+R^2+R^4+\ldots)=(TT)/(1-R^2) \quad (1)$$

This result has been obtained using the sum of a geometric series. If both top and back surfaces are just polished silicon-air then this results in a total transmittance of 54% and a reflectance of 46%.

If the increase in the individual path lengths caused by the diffuse scattering is neglected and, if the absorption coefficient is very low, then the total effective path length is determined by just the number of reflections, and the total absorption can be shown to be $$A=\alpha d(1+R_2)(1+R_1R_2+R_1^2R_2^2+\ldots)=\alpha d(1+R_2)/(1-R_1R_2) \quad (2)$$

Here, α, is the absorption coefficient in reciprocal cm and, d, is the thickness of the sample in cm, and the effective increase in path length is Enh=(1+R₂)/(1−R₁R₂). The internal quantum efficiency, IQE, in the infrared where the absorption in silicon is low is then, IQE=αd Enh. The external quantum efficiency, EQE, is EQE=T₁ IQE and EQE=T₁ αd Enh.

If both sides of an infrared photo detector or thin film silicon solar cell are polished then T₁=T₂=0.70 and R₁=R₂=0.3 which gives Enh=1.4, IQE=1.4 αd and EQE=αd.

An embodiment that improves the infrared response has the top side 101 polished but the back side 103 textured with an oxide 104 like silicon oxide or transparent conductive oxides 104 like zinc oxide, indium oxide, or tin oxide, and a metal like aluminum or silver or mirror reflector 105 behind. The texturing is realized in a fashion to produce a true diffuse scattering, a Lambertian scattering, at the infrared wavelengths. This diffuse scattering layer/reflecting layer combination, in essence, yields an R₂=100%, a diffuse reflector. The reflectance of the polished front side to the scattered light radiation is determined by solid angle considerations. Any incident light with an angle of incidence greater than the critical angle θ, 109, will be totally internal reflected, 111. If the backside scattering is totally diffuse or Lambertian, the transmittance is then determined by the area of the surface, πr², within the critical angle θ, 109, in this case 17° for silicon and air. The radius of the circle is r=d sin(17), where, d, is the thickness of the sample. This area is divided by the area of the half sphere, 2πd². If the backside scattering is totally diffuse the transmittance of the front planar surface is then roughly T₁=3% and the reflectance R₁=97%. The path length enhancement factor can be very large $$Enh=(1+R_2)/(1-R_1R_2)=66 \quad (3)$$

This would result in an IQE=66 αd and an EQE=46, this is consistent with Cotter's estimate defined as, 4η², where, η, is the optical index of refraction of the semiconductor, then for a backside textured silicon photodetector 4η²=51 in the near infrared where the index of refraction for silicon η=3.42. If the backside is a textured and truly diffusive scattering surface and a mirror like surface is used behind the back side, a very large enhancement of absorption in the near infrared can be achieved.

Figure 2:
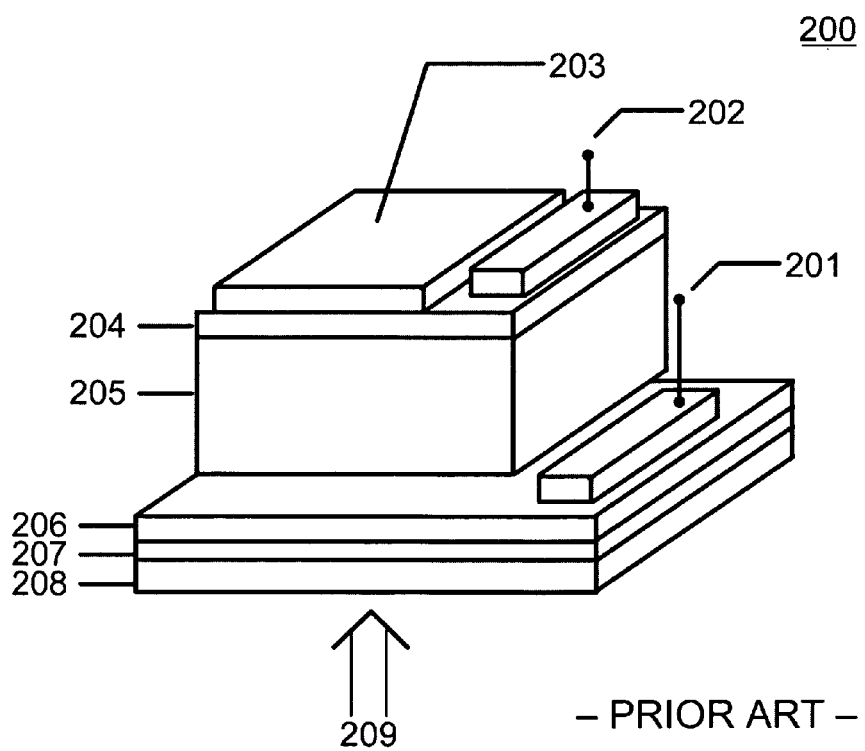
FIG. 2 is an illustration of a thin film microcrystalline solar cell.

Aberle has described a related technique for thin solar cells. As an aid to understanding, FIG. 2 reproduces an isometric view of Aberle's thin solar cell 200 with front side and backside electrical contacts 201 and 202, respectively. Aberle used white paint as the backside reflector. Aberle's initial results show a large increase in the absorption by the solar cell with the white paint as a back surface reflector but only a modest ten or twenty percent increase in the quantum efficiency, as shown herein in FIG. 3. These thin films are deposited on a glass plate, 208, covered with silicon nitride, 207. A seed layer, 206, is used to form the microcrystalline absorbing layer, 205. Layer, 204, is a heavily doped junction forming layer and 203 is a back surface reflector. Layer 203 is thick only in Aberle's case, in FIG. 2 it is shown as a thin metal reflector.

Figure 3:
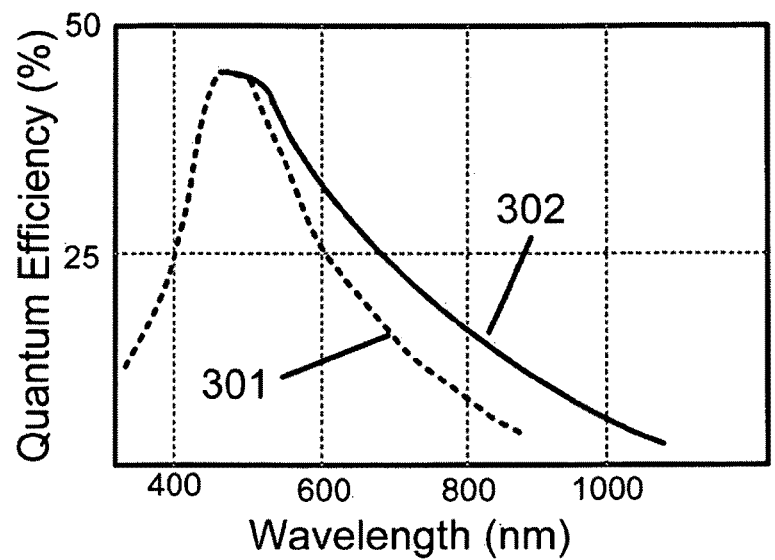
FIG. 3 is a graph of external quantum efficiency versus incident energy wavelength for a solar cell/photodetector with diffuse back surface reflector or Pigmented Diffuse Reflector (PDR), white paint, and without a diffusive backside reflector.

As shown in FIG. 3 the quantum efficiency, curve where a pigmented backside reflector, e.g. white paint, is used can be compared to a back surface without the pigmented back side. They indicate that a twenty to forty percent enhancement in conversion efficiency can be obtained on thin film microcrystalline solar cells by adding more titanium dioxide to the white paint. However, thick layers of the order 80 micrometers or more of paint are required on thin film solar cells 200 which in themselves are only a few micrometers thick.

Figure 4:
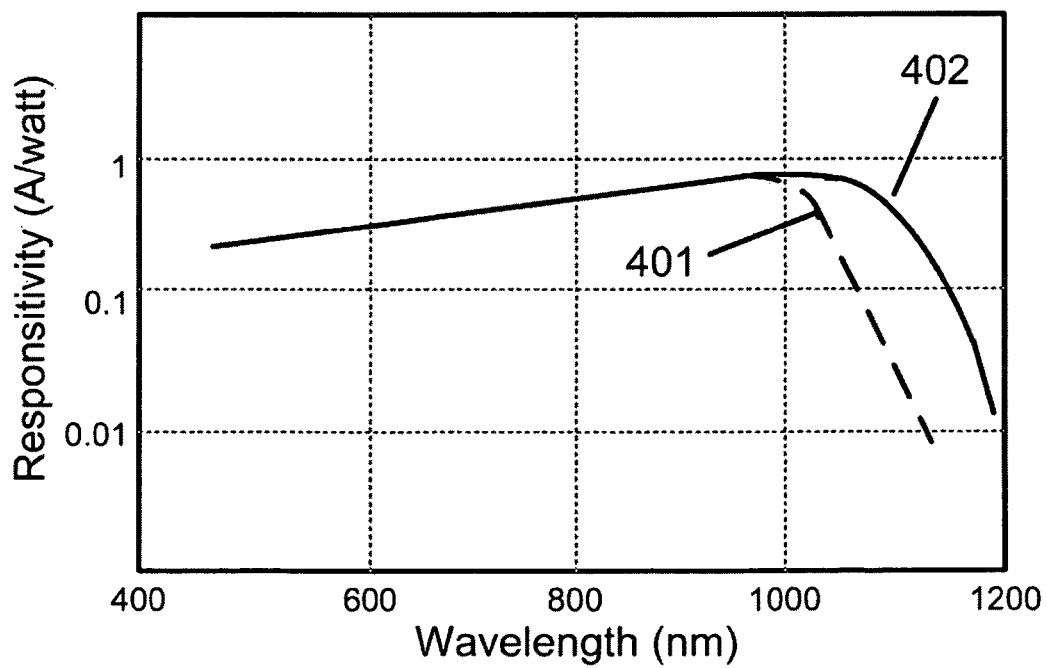
FIG. 4 is a graph of improvement in the infrared responsivity of a silicon solar cell/photodetector employing backside texturing and a backside mirror-like reflector.

FIG. 4 shows the improvement realized with one embodiment of the present invention on thick silicon samples for a backside textured Lambertian scattering surface in the near infrared. The normal or conventional results for a single pass of a 100 μm thick epitaxial sample curve 401 are compared to backside texturing with total internal reflections at the front side and light trapping in curve 402. "Light trapping" means that the light is confined by internal reflections in the semiconductor layer until it is absorbed. The enhancement factor observed at infrared wavelengths like 1100 nm is at least a factor of twenty. The 100 μm backside textured sample, curve 402, appears like a 700 μm sample with no texturing that is measured also as curve 402. A comparison is being made between the thinner 100 μm sample and a thick 700 μm sample. Multiple internal reflections without texturing but with an ideal metal backside reflector results in an enhancement factor from Eqn. 3 of about three. The 700 μm thick sample with no texturing, curve 402, but a backside metal reflector will then have an apparent of effective thickness of 2000 μm. A 100 μm sample could ideally have an enhancement of over 60 but in the practice this is limited by non-ideal losses so than the actual enhancement is around twenty and both samples have an apparent thickness of 2000 μm. This results in a useful absorption in silicon out to 1100 μm or the indirect bandgap energy of silicon.

If the absorption in the silicon layer is not assumed to be small but rather taken into account it can be shown that the enhancement factor for the internal quantum efficiency due to multiple reflections is modified from Eqn. 3 and becomes $$Enh=(1-\exp(-\alpha d))(1+R_2\exp(-\alpha d))/(1-R_1R_2\exp(-2\alpha d)) \quad (4)$$

This allows a calculation of the responsivity, in terms of the electrical current in Amperes per incident light power in Watts, of solar cells of different thickness, d, for different wavelengths, λ, since the absorption coefficient, α(λ), is a function of wavelength. If it is assumed that the backside is an ideal reflector, $R_2=1.0$, and the amount of diffusive scattering of the back surface varies from that of a planar surface then the fraction of light reflected back from the front surface will vary. If the back surface is planar then there is only specular reflection and, $R_1=0.3$, if the back surface is an ideal Lambertian diffusive surface then the fraction of light reflected back from the front surface will be very large, $R_1=0.97$. Several values of $R_1$ are discussed herein for a diffuse reflector, these represent the fraction of light internally reflected back at the front surface. For purposes of the present invention, values of $R_1 \geq 0.9$ are deemed particularly useful. The enhancement in absorption described by Equation 4 then varies with the fraction of light radiation reflected back from the front surface and thickness of the sample.

Figure 5:
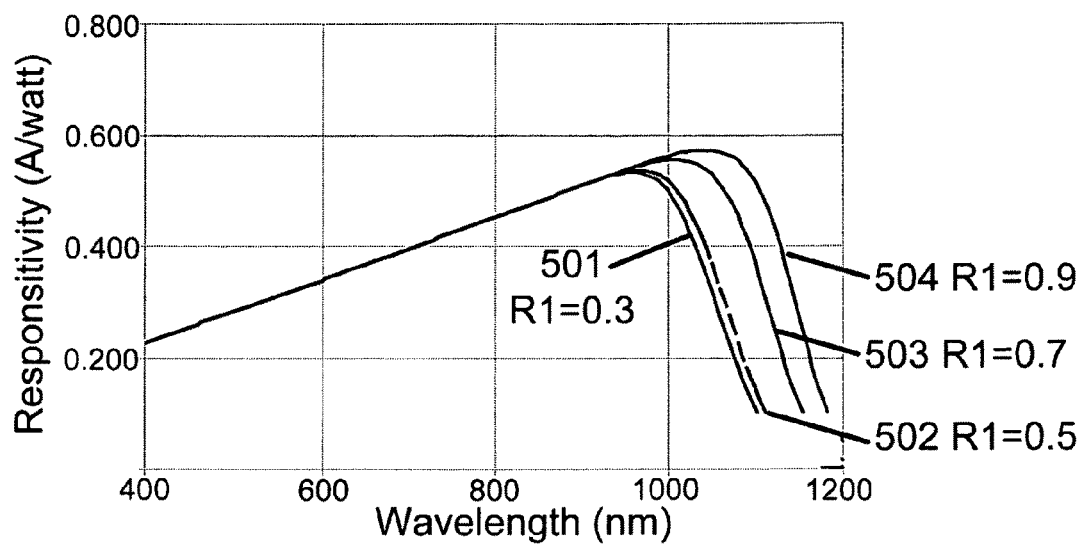
FIG. 5 is a graph of responsivity of a 200 μm thick crystalline solar cell with planar front surface and with different amounts of diffusive scattering at the back surface.

FIG. 5 compares the responsivity of a thick (d=200 μm) crystalline solar cell as the reflectivity, $R_1$, of the back surface is varied. When both the top surface and the back surface are planar ($R_1=0.3$), the response is indicated by curve 501, only 30% of the light is reflected back from the front surface and the estimated short circuit current for a solar cell of one square centimeter is 33 mA. The effect of varying $R_1$ is shown by the other curves, 502, 503, and 504, for which $R_1=0.5$, $R_1=0.7$ and $R_1=0.9$, respectively. Thus, a Lambertian diffusive reflecting back surface provides the optimum responsivity.

Figure 6:
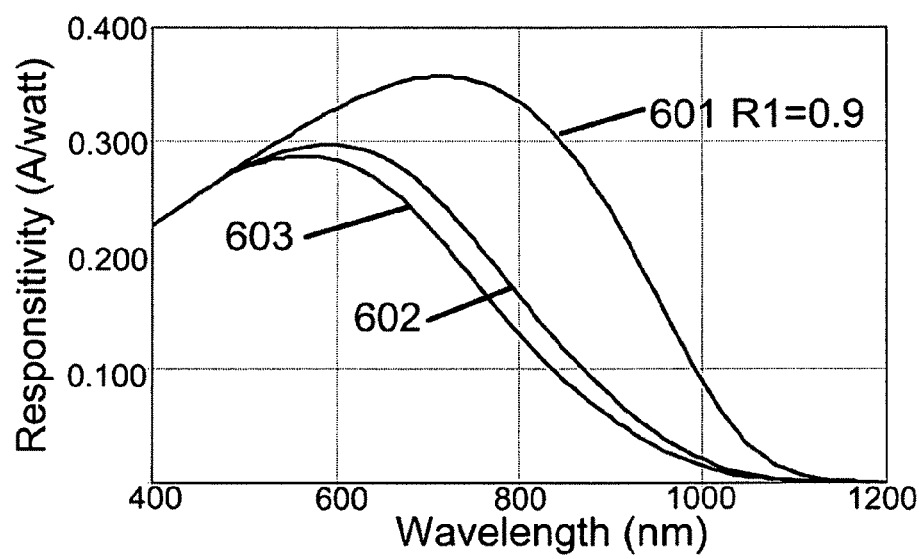
FIG. 6 is a graph of responsivity of a thin microcrystalline solar cell with different amounts of diffusive scattering at the back surface.

FIG. 6 is a graph of the calculated responsivity of one square centimeter thin film microcrystalline silicon solar cell with a scattering at the back surface and with a reflector. There can be varying values of the amount of light reflected back from the front surface of 30%, 50% and 90%. If $R_1=0.9$, curve 601, then most of the energy in the red and infrared incident radiation is absorbed and a short circuit solar cell current of 25 mA is calculated. Thus, the conversion efficiency approaches that of thick crystalline solar cells that are one hundred times thicker. The other curves, 602 and 603, show the effect of varying $R_1$ to values of 0.7 and 0.5, respectively.

Figure 7:
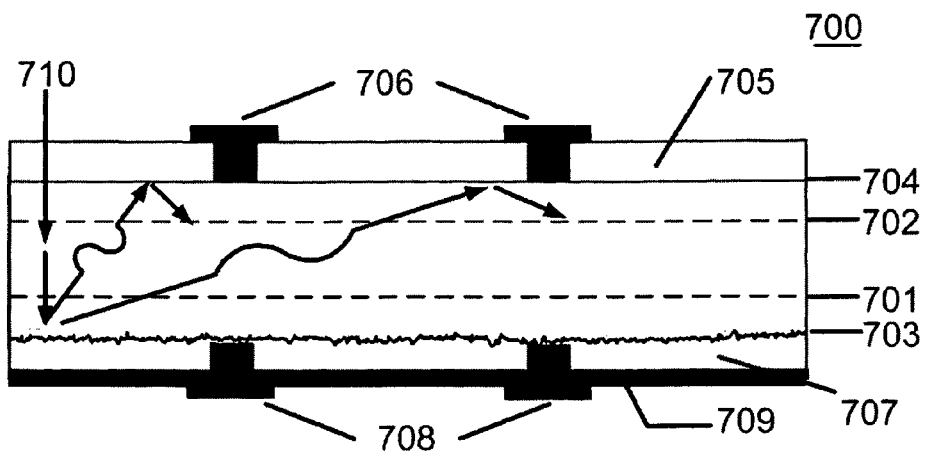
FIG. 7 is a cross sectional illustration of a thin film microcrystalline silicon solar cell/photodetector which may employ the present invention.

A thin solar cell/photodetector is shown in FIG. 7. This solar cell differs from the one described by Aberle in that a thin textured Lambertian scattering back surface 703 is backed by a thin reflecting surface 709 rather than a thick layer of white paint a many times thicker than the solar cell, up to 80 micrometers thick, as in a Pigmented Diffuse Feflector (PDF) with embedded titanium oxide nanoparticles. The solar cell as disclosed herein is either a crystalline silicon p-i-n diode or a microcrystalline silicon p-i-n diode. The semiconductor junction layer 701 at the back and the semiconductor junction layer 702 at the front are any of conventional implanted or diffused junctions or, for heterojunctions, doped amorphous silicon layers. For optimum infrared and long wavelength red response, the backside is textured with a Lambertian scattering layer 703, the scattering region may be due to a treatment of the silicon material or of the oxide layer, and backed by a reflecting layer 709, while the front side is a reflective planar surface 704. As shown before a very large enhancement can be obtained in the infrared response by the total internal reflection of the incident infrared light, represented by arrow 710, incident on the backside diffuse scattering surface 703 and reflector 709. Thin layers of microcrystalline silicon are used for solar cells and multiple internal reflections used to increase the absorption of infrared and the longer wavelengths of visible red light. Thus, an embodiment is an amorphous silicon, microcrystalline-amorphous silicon thin film n-i-p heterojunction solar cell. The front side 704 has an oxide or transparent conductive oxide layer 705 that is anti-reflecting to visible light, although this anti-reflecting property may be omitted in alternate embodiments, and electrical contacts 706. The backside has an oxide or transparent conductive oxide layer 707 and electrical contacts 708.

An alternative embodiment is to use front side texturing for the semiconducting substrate that provides diffusive scattering to infrared light. This alternative results in increased path lengths and increased absorption for infrared radiation, particularly if the backside of the substrate is reflective or a reflective metal contact. The enhancement of the absorption of infrared light energy will not be as great as it can be with backside diffusive scattering since the number of passes is limited; it is easier for the infrared light reflected from the back to escape out of the textured front than it would be to escape from a planar front side. As a result the average number of passes of infrared light that is not strongly absorbed is estimated to be limited to about three; still, some significant increase in energy conversion efficiency of solar radiation can be achieved since the individual path lengths of scattered light are greater than the thickness of the substrate. As before the textured front side that provides diffusive scattering to infrared light can be covered with a layer of conductive or insulating oxide that is anti-reflecting to visible light. This then also ensures optimum absorption of visible light.

Figure 8:
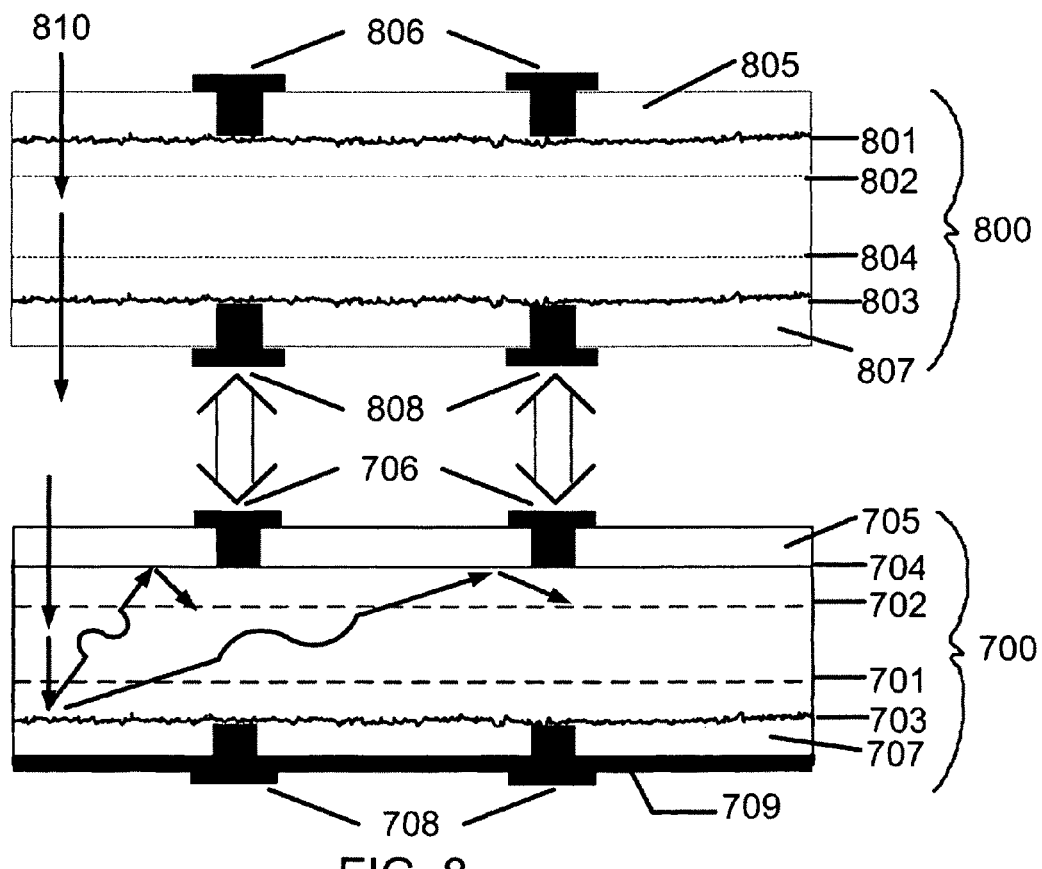
FIG. 8 is a cross sectional illustration of stacked solar cells/photodetectors for absorption of visible light in the top cell and absorption of infrared light in the bottom cell and which may employ the present invention.

FIG. 8 is a cross section of a stacked pair of solar cells/photodetectors 800, 700 which receive incident electromagnetic radiation, illustrated by arrow 810, at a front surface of cell 800. The band of electromagnetic radiation that encompasses visible light is primarily absorbed, that is, converted to electricity, in cell 800. The band of electromagnetic radiation that encompasses infrared and long wavelength red light is primarily absorbed in cell 700. The maximum benefits of texturing can be achieved by using a structure consisting of the two stacked solar cells, as shown. As used herein the term "stacked" means two separate solar cells, one mounted atop the other with a gap between them. Consider the arrangement in which a semiconductor solar cell 700, as previously described in relation to FIG. 7, is oriented such that a second semiconductor solar cell 800 is interposed between the cell 700 and the source of incident radiation. Herein, such an arrangement will deem solar cell 800 to be the top cell and solar cell 700 to be the bottom cell. The bottom cell semiconductor junctions at the back, 701, and front, 702, can either be conventional implanted or diffused junctions or doped amorphous silicon layers to form heterojunctions. The top solar cell 800 has a textured front layer 801 that transmits and allows absorption of visible light within top cell 800, and a textured back layer 803. Layer 801 is textured to transmit visible and infrared light and the texture of back layer 803 transmits infrared light. The bottom solar cell 700 has a smooth front layer 704 and textured back layer 703 that scatters infrared light energy. Most infrared light, depicted as arrow 810, just passes through the top solar cell 800 and is not absorbed; the front textured layer 801 and back textured layer 803 in the top solar cell 800 are designed to be an antireflective layers that just transmit infrared light. The bottom solar cell 700 absorbs most of the infrared light energy due to multiple internal reflections and trapping of the infrared light, as described in conjunction with FIG. 7. The planar front surface 704 is internally reflective to infrared light that is scattered and reflected from the backside. The planar front surface 704 has disposed thereon an oxide or transparent conductive oxide 705 that has electrical contacts 706, and has, at the option of the designer, anti-reflecting properties to visible light. The backside of cell 700 has an oxide or transparent conductive oxide layer 707 and electrical contacts 708.

The front side of cell 800 has an oxide or transparent conductive oxide layer 805 that may or may not be anti-reflecting to visible light, disposed on the textured front layer 801 and electrical contacts 806. The backside of cell 800 has an oxide or transparent conductive oxide layer 807 disposed on textured back layer 803 and electrical contacts 808. Each of the electrical contacts makes a very low resistance connection to the silicon and its associated oxide layer, that is, electrical contacts 706 electrically connect to oxide layer 705, electrical contacts 708 electrically connect to oxide layer 707, electrical contacts 806 electrically connect to oxide layer 805, and electrical contacts 808 electrically connect to oxide layer 807. Electrical contact between the two cells 800, 700 is provided by backside contacts 808 and front side contacts 706, respectively. The efficiency of stacked or tandem cells 800 will be about 25% higher than a single cell.

A variation to the embodiment of FIG. 8 employs a stacked configuration of textured amorphous silicon, microcrystalline-amorphous silicon thin film n-i-p heterojunction solar cells. It is to be noted that this configuration is different than the-tandem configuration described in the aforementioned Choi patent. The present stacked configuration has a large discontinuity in the index of refraction between the two cells 800, 700 by virtue of having a space between the cells, which is also useful in enabling electrical connections between the cells; the Choi tandem configuration is all one material and does not have this. This discontinuity in the index of refraction due to the space is responsible for multiple internal reflections in the bottom cell 700.

An alternative embodiment allows the cells to be one continuous piece of material, as in the Choi tandem cell configuration, without a discontinuity in the index of refraction at the center but with a planar front and textured back with reflector. This arrangement also results in total internal reflections and light trapping and has not been disclosed by Choi.

Texturing of the backside layer of photodetectors or solar cells can be accomplished by any one of several well known techniques, where these include the removal of silicon material by chemical etchants, plasma etching, porous silicon etchants, lasing to produce black silicon, anisotropic etches like KOH, texturization by sodium carbonate, masking to produce nanostructures by isotropic etch of the silicon, and masking techniques including nanoimprint masks. Diffusive layers are most easily produced by etches, like porous silicon etches, that produce random features. Porous silicon structures have been described in Tsuo for the front side of substrates to reduce reflectance of visible light. However, such structures have not been described for the backside of substrates to produce diffusive reflectance of red and infrared light. As considered herein, diffuse reflective layers that are added to the backside of photodetectors or solar cells are random features that produce diffusive layers at selected wavelengths for incident electromagnetic energy, where these structures include hemispherical grains of polysilicon, titanium oxide nanoparticles embedded in oxide, Atomic Layer Deposition (ALD) of metals, and hexagonal nanocystals produced by diffusion of metals like tungsten or tantalum into amorphous silicon. Grains or nanoparticles are random features that produce diffusive layers for incident light. If necessary to increase reflectivity the structures formed are covered with oxide or transparent conductive oxide and a reflective metal layer.

The backside texturing described herein preferably produces diffusive scattering of light, either forward diffusive scattering, reflected diffuse scattering or both. This diffuse scattering is to be distinguished from specular reflection and reflections from regular geometric structures and shapes. Regular geometric structures and shapes like trenches, ridges, saw tooth patterns, or pyramids or etch structures produced by KOH alone will only reflect or scatter light at specific angles with respect to the incident light and is not diffusive. Although Mandelkorn describes a ground and silvered bottom glass cover plate separated from the substrate, Mandelkorn does not describe structures etched into or deposited on to the substrate. Ground structures of regular sizes, such as those taught by Mandelkorn, are not diffusive and because of separation from the substrate the light reflected into the substrate will be refracted towards the normal and not diffusive. The Green patent ridges and pyramids etched into the substrate, but these produce reflections only at specific angles and are not diffusive. The Matsuyama patent discloses solar cells CVD deposited upon opaque substrates with linear recesses, unlike the present solar cells disclosed herein, which have random irregularies of various sizes etched or deposited on planar surfaces. The material at the backside of the cell or deposited on the backside of the solar cell disclosed herein is reflective, not simply opaque. Diffuse scattering produced by random features occurs over a range of angles at the desired band of wavelengths and in the present invention approaches the ideal Lambertian scattering. Ideal reflective Lambetrian scattering provides light distributed over the whole half sphere or a solid angle of $2\pi$ sterradians. Herein the use backside texturing provides diffusive reflective light scattering at the backside and planar front side surfaces to provide for total internal reflections at the front side and multiple passes of red and infrared light in silicon solar cells. The front surface preferably has an anti-reflecting layer for visible light, but this layer does not significantly affect the reflectivity of the front surface to infrared light.

Thus, a solar cell/photodetector has been described that provides optimal conversion of visible light and infrared energy to electricity. Backside texturing with diffusive scattering and frontside internal reflection produce a large enhancement of conversion efficiency. One embodiment of the present invention uses a set of cusps etched into the backside of solar cells to provide diffusive scattering.

With the teachings of Born and Wolf in mind, one realizes that slits can be replaced by reflective strips in an absorbing material. Consider firstly light of one particular wavelength, or wavenumber, k. For an array of n strips of width, s=2a, and equal spacing, d, with the light vertically incident, the intensity of the diffracted light on a screen, I, is proportional to:

$$I \sim (H(ndkp/2)\text{sinc}(skp/2))^2 \quad (5)$$

sinc(x) is the ratio, sin(x)/x, and p=sin θ, θ is the angle from the vertical at which the light is diffracted. The formula for the intensity is valid if the observing screen is much farther away than, a or d, or namely, the Fraunhofer diffraction regime. In this case, the diffraction pattern is equivalent to the Fourier transform of the diffraction grating. For a single strip of finite width, the diffraction pattern has the well-known form of a sinc function. For multiple slits of finite width, the diffraction is a pattern of peaks and troughs of the aperture, n d, whose locations are described by the interference function, H, and whose intensity is modulated by the sinc function pattern arising from a single strip. The envelope of the intensities of the regular diffraction pattern observed on the screen is a sinc function. (Alternative derivations to that in Born and Wolf are to firstly recognize that a set of narrow strips are described by the convolution of a series of delta functions with a single strip, so the Fourier transform of the grating is the product of the transform of a series of delta functions, which yields H times the Fourier transform of a single strip the sinc function. This yields H~sin(ndkp/2)/sin(dkp/2). Secondly another approach is to use the time shift theorem in Fourier transforms, if the transform of a single element f(x) is, F(k), the transform of each element displaced in time or in this case space by the specific distance, d, will be f(x−d)=F(k) exp(−ikd). This latter technique works best in dealing with a series of elements at random locations.

Figure 9A:
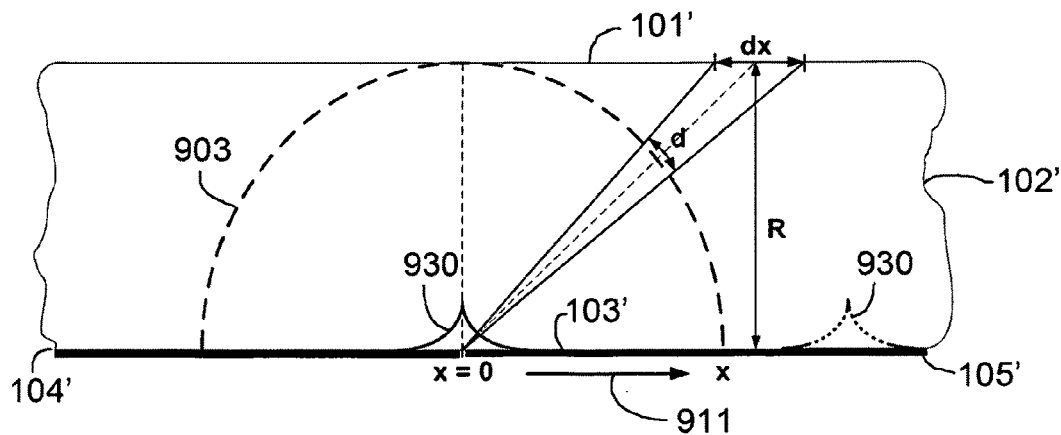
FIG. 9A is an illustration of a solar cell or photodetector cross section similar to that of FIG. 1, wherein cusped features disposed on the silicon backside provides diffusive scattering.
Figure 9B:
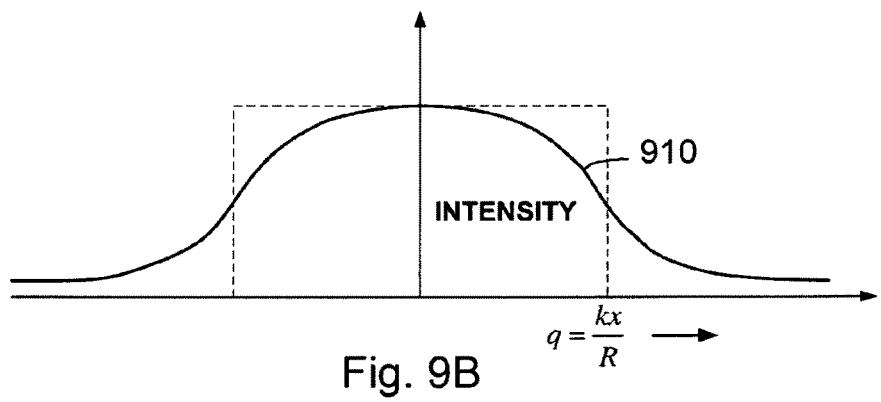
FIG. 9B is an intensity versus distance graph of Lambertian scattering from a single cusped feature, such as that of FIG. 9A.
Figure 9C:
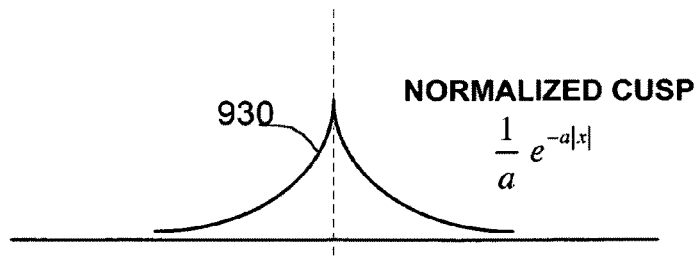
FIG. 9C illustrates an inverse Fourier transform of a cusped feature providing uniform scattering on a hemisphere.
Figure 10A:
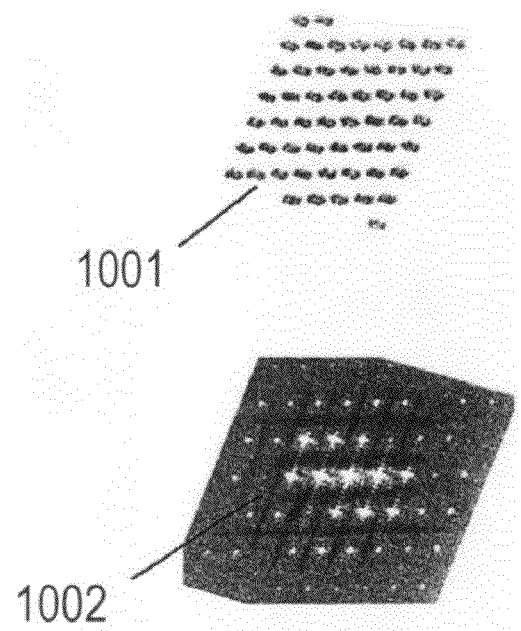
FIGS. 10A and 10B show the effect of scattering by a regular array of cusps and a random arrangement of cusps, respectively.
Figure 10B:
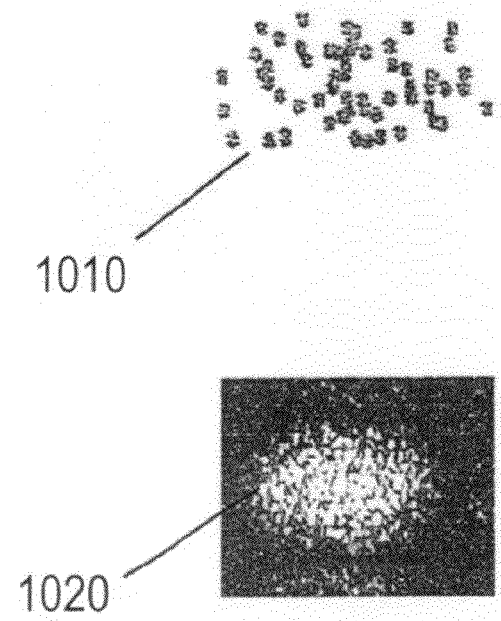

Consider now a solar cell as shown in FIG. 9A, similar to FIG. 1, where light incident on the top or front surface 101' passes through the cell and strikes a textured 104' reflective 105' surface at the bottom or back surface 103' of the solar cell. Lambertian scattering by a single element into a hemisphere will, as shown in FIG. 9B, result in a Lorentzian intensity pattern 910, depicted in the intensity versus distance graph of FIG. 9B for scattered light displayed on a flat screen. Light will be scattered large distances in the "x" direction 911 as a result of the substantially uniform intensity pattern on the hemisphere 903. In order to achieve Lambertian scattering, one must find the inverse Fourier transform of the Lorentzian and use this for the shape of a single element providing scattering or for each element providing diffraction in an array. The Fourier transform of each element providing scattering will then give uniform illumination of a hemisphere 903 and a Lorentzian shape 910 on the flat screen. The inverse Fourier transform of a Lorentzian is a "cusp" 930 as shown in FIG. 9C and in the cusped features (in exaggerated form for clarity) in FIG. 9A. A series or array of such regular cusped features, disposed with the base portion of the cusped feature toward the reflective layer 105' of bottom surface 103' (away from the front surface 101'), results in a series of dots of light being presented at the top surface 101' with an intensity described by a Lorentzian envelope over a wide range of distances. Each dot will have the shape and location described by the interference function, H, of the aperture defining the region occupied by the "cusps." This regular array of cusped features 1001 disposed on a surface, like surface 103', produces a regular diffraction pattern of dots 1002 on the front surface 101' as shown in FIG. 10A (c.f. Born and Wolf). Likewise a random array 1010 of cusped features formed on a surface, like surface 103', will also work as well; these produce a random array of dots 1020 on the front surface 101' or a "fuzzy" pattern as shown in FIG. 10B (c.f. Born and Wolf).

In the case of a solar cell with very wide features there is essentially no aperture. A regular array or random arrangement of cusped features on the backside results in Lambertian scattering from each element separately and optimal scattering. In the case of solar cells there need be no concern about the accumulative effect of a large number of "cusps" and whether or not they form a regular diffraction pattern. We need only be concerned here that the scattering from each element be Lambertian, this will insure a maximum of total internal reflection back from the silicon side of the front surface. The scattering from each cusp will be a diffusive or nearly diffusive scattering. The embodiments of the present invention illustrated in FIGS. 7 and 8, in alternative embodiments, employ the cusped-featured surface as the scattering layer 703. Moreover, in a stacked arrangement, as depicted in FIG. 8, the front textured layer 801 and the back textured layer 803 are of cusped feature design, in which the cusp dimensions are tuned to transmit infrared light.

A random array of such "cusps", in one embodiment, are etched into the backside of a silicon wafer by porous silicon and metal catalyst etches such as described by S. W. Chang et al. or S. Brieger et al. In one embodiment of the present invention, the porous silicon or metal catalyst etched vertical holes are etched with a conventional isotropic silicon etch to round off the shape corners resulting in a cusp like structure. A thin layer of oxide is either grown or deposited or another dielectric deposited and the backside covered by a reflective metal. In this manner a random array of cusp like scattering centers can be formed on the back of silicon solar cells. Alternative regular arrays are formed by using the self-assembly features of metal catalyst etchants.

Of course, it is to be understood that the above-described arrangements are only illustrative of the application of the principles of the present disclosure. Numerous modifications and alternative arrangements may be devised by those skilled in the art without departing from the spirit and scope of the present disclosure is intended to cover such modifications and arrangements. In particular the term "cusps" describes not only those following the exponential functional form but also any structure exhibiting a similar "cusp-like" shape. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A semiconductor solar cell or photodetector having improved incident radiation absorption, comprising:
   a first silicon substrate having a substantially planar first surface available to the incident radiation and a second surface;
   a layer disposed at said substantially planar first surface, said layer being transparent to visible light and infrared wavelengths of incident radiation and internally reflective to said infrared wavelengths of radiation scattered within said first silicon substrate; and
   a textured layer disposed at said second surface, said textured layer comprising a plurality of cusped features, each having a shape of an inverse Fourier transform of a Lorentzian intensity pattern and disposed with bases of said plurality of cusped features arranged away from said first surface, adapted to form a substantially Lambertian radiation scattering layer for said infrared wavelengths of radiation.

2. The semiconductor solar cell or photodetector of claim 1 further comprising a reflecting layer disposed at said textured layer and spaced apart from said second surface by said textured layer, whereby infrared wavelengths of radiation are returned through said textured layer toward said substantially planar first surface.

3. The semiconductor solar cell or photodetector of claim 2 wherein said reflecting layer comprises an oxide that is substantially transparent to infrared wavelengths of radiation and further comprises a reflective metallic layer.

4. The semiconductor solar cell or photodetector of claim 1 wherein said first silicon substrate further comprises single crystalline silicon or multi-crystalline silicon having a thickness in a range of 5 micrometers to 500 micrometers.

5. The semiconductor solar cell or photodetector of claim 1 wherein said first silicon substrate further comprises deposited microcrystalline silicon having a thickness in a range of 1 micrometer to 10 micrometers.

6. The semiconductor solar cell or photodetector of claim 1 wherein said first silicon substrate further comprises deposited amorphous silicon having a thickness in a range of 1 micrometer to 10 micrometers.

7. The semiconductor solar cell or photodetector of claim 1 wherein said first silicon substrate further comprises both deposited microcrystalline silicon and deposited amorphous silicon having a thickness in a range of 1 micrometer to 10 micrometers, arranged as one of either (a) an amorphous layer and then a microcrystalline layer and an amorphous layer, or (b) an amorphous layer and a microcrystalline layer.

8. The semiconductor solar cell or photodetector of claim 1 wherein said textured layer further comprises one of a regular array of cusped features and a random array of cusped features.

9. The semiconductor solar cell or photodetector of claim 8 wherein said one of said regular array and said random array further comprises an etched one of said regular array and said random array.

10. The semiconductor solar cell or photodetector of claim 1 further comprising first and second microcrystalline silicon junction diode materials disposed substantially in planes parallel to said first surface.

11. The semiconductor solar cell or photodetector of claim 1 wherein said layer disposed at said first surface further comprising a layer that is anti-reflective to visible light wavelengths of radiation.

12. The semiconductor solar cell or photodetector of claim 1 further comprising:
   a second silicon substrate having a textured second substrate first surface available to the incident radiation and a second substrate second surface, said second substrate second surface disposed adjacent said first silicon substrate first surface;
   a second substrate layer disposed at said second substrate first surface, said second substrate layer comprising a layer that is anti-reflective to infrared and visible light wavelengths of incident radiation;
   a second substrate second textured layer disposed at said second substrate second surface, said second substrate textured layer comprising a layer that is anti-reflective for infrared wavelengths of radiation.

13. The semiconductor solar cell or photodetector of claim 12 wherein said first and second silicon substrates are stacked and wherein said second substrate second surface and said first semiconductor substrate first surface are separated by a gap that creates a discontinuity of index of refraction at least greater than 1.0.

14. The semiconductor solar cell or photodetector of claim 13 wherein said second silicon substrate comprises second substrate first and second amorphous silicon junction diode materials disposed substantially in planes parallel to said second substrate first surface.

15. The semiconductor solar cell or photodetector of claim 14 wherein said second substrate first and second surface, and first substrate first surface, are parallel and said first substrate first surface and said second substrate second surface are continuous semiconducting material and the first substrate second surface is textured.

16. The stacked semiconductor solar cell or photodetector of claim 15, wherein said first substrate textured layer plurality of cusped features further comprises one of a regular array of cusped features and a random array of cusped features.

17. A stacked semiconductor solar cell or photodetector having improved incident radiation absorption, comprising:
   a second silicon substrate, said second substrate having a first surface available to the incident radiation and a second surface upon which is disposed a conductive infrared transparent layer upon which a first electrical contact is disposed, said second substrate being substantially transparent to infrared wavelengths of the incident radiation;
   a first silicon substrate having a substantially planar first silicon substrate first surface disposed opposite said second substrate second surface across a gap and spaced apart from said second substrate second surface by said gap such that a difference between the index of refraction of said first silicon substrate and said gap results in infrared wavelength energy internally scattered toward a first silicon substrate first layer being reflected back into said first substrate; and
   said first silicon substrate comprising a first substrate conductive infrared transparent layer disposed on said first substrate first surface, upon which a second electrical contact is disposed and arranged to make electrical connection with said first electrical contact, a first substrate textured layer comprising a plurality of cusped features, each having a shape of an inverse Fourier transform of a Lorentzian intensity pattern and disposed at said first substrate second surface with bases of said plurality of cusped features arranged away from said first substrate first surface and adapted to form a diffusive radiation scattering layer for infrared wavelengths of radiation.

18. The stacked semiconductor solar cell or photodetector of claim 17 further comprising a first substrate reflective layer disposed on said first substrate textured layer, whereby infrared wavelengths of radiation are returned through said first substrate textured layer toward said first silicon substrate.

19. The stacked semiconductor solar cell or photodetector of claim 17, wherein said second silicon substrate further comprises:
    a textured first layer disposed at said first surface, said layer being transparent to visible light and infrared wavelengths of incident radiation;
    a transparent second layer disposed at said textured first layer;
    a textured third layer disposed at said second surface, said textured layer being transparent to infrared wavelengths of incident radiation; and
    a transparent fourth layer disposed at said textured third layer.

20. The stacked semiconductor solar cell or photodetector of claim 19, wherein said first substrate reflecting layer comprises an oxide that is substantially transparent to infrared wavelengths of radiation and said reflective metallic layer.

21. The stacked semiconductor solar cell or photodetector of claim 17, wherein said first substrate further comprises both deposited microcrystalline silicon and deposited amorphous silicon having a thickness in a range of 1 micrometer to 10 micrometers arranged as one of (a) an amorphous layer and then a microcrystalline layer and (b) an amorphous layer, a microcrystalline layer, and another amorphous layer.

22. The stacked semiconductor solar cell or photodetector of claim 17 wherein said diffusive radiation scattering layer further comprises a substantially Lambertian radiation scattering layer.

23. A semiconductor solar cell or photodetector having improved incident radiation absorption, comprising:
    a first silicon substrate having a substantially planar first surface available to the incident radiation and a second surface;
    a first layer disposed at said first surface, said layer being transparent to visible light and infrared wavelengths of incident radiation and internally reflective to said infrared wavelengths of radiation scattered within said first silicon substrate;
    said second surface having a plurality of cusped features, each having a shape of an inverse Fourier transform of a Lorentzian intensity pattern and disposed with bases of said plurality of cusped features arranged away from said first surface, adapted to form a diffusive radiation scattering layer for infrared wavelengths of radiation; and
    a reflective layer spaced apart from said second surface.

24. The semiconductor solar cell or photodetector of claim 23 further comprising a second layer disposed at said second surface and spacing said reflective layer away from said second layer, said second layer being transparent to the incident radiation.

25. The semiconductor solar cell or photodetector of claim 23 wherein said reflective layer further comprises a metal layer.

* * * * *